(12) United States Patent
Kesselring et al.

(10) Patent No.: US 10,778,146 B2
(45) Date of Patent: Sep. 15, 2020

(54) INTEGRATED CIRCUIT VOLTAGE-CONTROLLED OSCILLATOR WITH LATE-STAGE FABRICATION TUNING

(71) Applicant: International Business Machines Corporation, Armonk, NY (US)

(72) Inventors: Grant P. Kesselring, Rochester, MN (US); James Strom, Rochester, MN (US); Scott Trcka, Rochester, MN (US); Ann Chen Wu, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 144 days.

(21) Appl. No.: 16/011,793

(22) Filed: Jun. 19, 2018

(65) Prior Publication Data

US 2019/0386614 A1 Dec. 19, 2019

(51) Int. Cl.
*H03B 5/12* (2006.01)
*H03L 7/099* (2006.01)
*H05K 1/02* (2006.01)

(52) U.S. Cl.
CPC ......... *H03B 5/1243* (2013.01); *H03B 5/1212* (2013.01); *H03B 5/1225* (2013.01); *H03B 5/1228* (2013.01); *H03B 5/1281* (2013.01); *H03B 5/1296* (2013.01); *H03L 7/099* (2013.01); *H05K 1/0231* (2013.01); *H03B 2201/0208* (2013.01)

(58) Field of Classification Search
CPC .. H03B 5/1296; H03B 5/1228; H03B 5/1243; H03B 5/1212; H03B 5/1281; H03B 5/1225; H03B 5/2201; H03B 5/0208; H05K 1/0231; H01L 21/4857; H03L 7/099
USPC ............... 257/691, 690; 438/612, 637, 672; 331/167, 177 V, 117 FE, 108 C
See application file for complete search history.

(56) References Cited

U.S. PATENT DOCUMENTS

| | | | |
|---|---|---|---|
| 6,720,834 B2 | 4/2004 | McCarthy et al. | |
| 7,084,713 B2 | 8/2006 | Peluso | |
| 7,216,422 B2 * | 5/2007 | Fan | H05K 1/0231 174/260 |
| 7,692,284 B2 * | 4/2010 | Eilert | H01L 21/4857 257/690 |
| 7,855,610 B2 | 12/2010 | Taghivand et al. | |
| 8,294,528 B2 | 10/2012 | Li et al. | |
| 9,673,755 B1 * | 6/2017 | Yavorskyy | H03B 5/1296 |
| 2013/0169368 A1 | 7/2013 | Rehman | |

* cited by examiner

*Primary Examiner* — Arnold M Kinkead
(74) *Attorney, Agent, or Firm* — Nathan M. Rau

(57) ABSTRACT

A voltage-controlled oscillator (VCO) having an operating frequency dependent on a total capacitance of selectable tuning capacitors can be fabricated within an integrated circuit (IC). The VCO can include active electronic devices fabricated within a set of lower layers of the IC and selectable tuning capacitors having electrically conductive structures separated by dielectric material fabricated within a set of upper layers of the IC. The upper layers of the IC are located above the set of lower layers of the IC. The VCO can also include a set of interconnect structures configurable to select a total capacitance of the selectable tuning capacitors by electrically interconnecting the first portion of the VCO to capacitors of the at least one selectable tuning capacitor.

19 Claims, 3 Drawing Sheets

INTEGRATED CIRCUIT VOLTAGE-CONTROLLED OSCILLATOR WITH LATE-STAGE FABRICATION TUNING

BACKGROUND

The present disclosure generally relates to integrated circuits (ICs). In particular, this disclosure relates to the late-stage fabrication of electronic circuit elements used to tune a VCO circuit fabricated as part of the IC.

An IC, also known as a "microchip," silicon or computer "chip," is a specially prepared piece of silicon, or other semiconductor material, into which a complex electronic circuit is etched and formed using a photolithographic process. IC types can include computer processors, memory, analog, and customizable devices. ICs can be relatively fragile, and therefore are often mounted on and/or surrounded by a protective, supportive ceramic or plastic package. Electrical connections to the chip can be provided through metal contacts, which can include pins or solder balls located on the exterior of the chip package.

ICs can have certain advantages over comparable discrete circuits, such as relatively low-cost and high-performance. The cost of an IC can be relatively low, resulting from the large number, e.g., millions, of transistors that can be simultaneously printed as a complete functional unit by photolithographic techniques, rather than constructing an equivalent circuit from individually fabricated transistors. Performance of an IC can be significantly higher than an equivalent discrete circuit, due to the high density and relatively low electrical interconnect parasitics between active devices such as transistors. Types of ICs may include analog, digital and "mixed signal" chips, i.e., chips that incorporate both analog and digital functions on the same silicon die.

A capacitor is a passive electrical component having at least two electrical conductors known as plates, separated by a dielectric or insulator, and which may be used to electrostatically store energy in an electric field. Capacitors may be useful as circuit elements in conjunction with a variety of types of electronic devices such as digital and analog ICs.

SUMMARY

Embodiments may be directed towards a voltage-controlled oscillator (VCO) fabricated within an integrated circuit (IC). The VCO can have an operating frequency at least partially dependent on a total capacitance of at least one selectable tuning capacitor. The VCO can have a first portion that includes active electronic devices fabricated within a set of lower layers of the IC. The VCO can also include a second portion, fabricated within a set of upper layers of the IC located above the set of lower layers of the IC. The second portion can include the at least one selectable tuning capacitor having electrically conductive structures separated by dielectric material. The VCO can also include a set of interconnect structures that is configurable to select a total capacitance of the at least one selectable tuning capacitor by electrically interconnecting the first portion of the VCO to capacitors of the at least one selectable tuning capacitor.

Embodiments may also be directed towards an IC. The IC can include a set of lower layers and a set of upper layers located above the set of lower layers. The IC can also include a tunable circuit having an operating frequency at least partially dependent on a total capacitance of at least one selectable tuning capacitor. The tunable circuit can include a first portion that includes active electronic devices fabricated within the set of lower layers and a second portion, fabricated within the set of upper layers, that includes the at least one selectable tuning capacitor having electrically conductive structures separated by dielectric material. The tunable circuit can also include a set of interconnect structures that is configurable to select a total capacitance of the at least one selectable tuning capacitor by electrically interconnecting the first portion of the tunable circuit to capacitors of the at least one selectable tuning capacitor.

Embodiments may also be directed towards a method, performed by a set of electronic design automation (EDA) tools executed by at least one processor circuit, of modifying an operating frequency of a VCO circuit within an IC. The VCO includes a first portion containing active electronic devices fabricated within a set of lower layers of the IC and the VCO further includes a second portion containing at least one selectable tuning capacitor fabricated within a set of upper layers of the IC. The operating frequency of the VCO is at least partially dependent on a total capacitance of the at least one selectable tuning capacitor. The method can include extracting, with the set of EDA tools, an initial VCO netlist from an initial VCO layout. The initial VCO layout can be stored in an IC design file and can include the at least one selectable tuning capacitor. The method can also include simulating, with the set of EDA tools, the initial VCO netlist to produce initial simulation results, the initial simulation results being stored in the design file. The method can also include comparing, with the set of EDA tools, the initial simulation results to a set of performance requirements to produce an initial performance difference. The method can also include adjusting, with the set of EDA tools, according to the initial performance difference being outside of a specified range, an amount of selectable tuning capacitance. The adjusting can include changing, in the IC design file, data representing a set of interconnect structures configured to electrically connect the first portion of the VCO to the second portion of the VCO. The changing can produce, within the IC design file, a modified VCO layout having a modified total capacitance of the at least one selectable tuning capacitor. The method can also include extracting, with the set of EDA tools, a modified VCO netlist from the modified VCO layout and simulating, with the set of EDA tools, the modified VCO netlist to produce updated simulation results. The method can also include comparing, with the set of EDA tools, the updated simulation results to the set of performance requirements to produce an updated performance difference.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1:
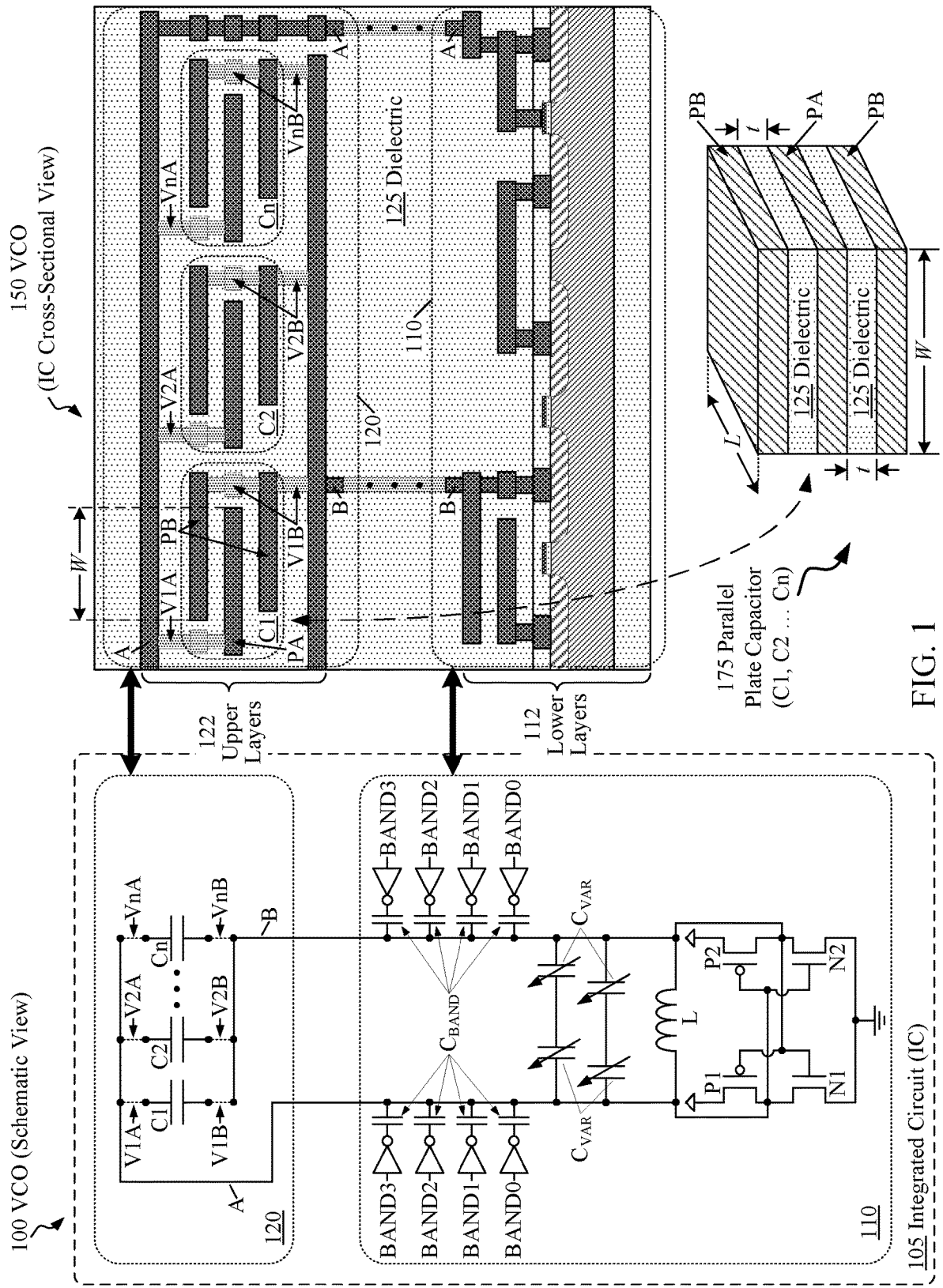
FIG. 1 includes a schematic depiction of a voltage-controlled oscillator (VCO) circuit within an integrated circuit (IC), and consistent cross-sectional views of the VCO circuit within the IC and parallel plate capacitors, according to embodiments of the present disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

In the drawings and the Detailed Description, like numbers generally refer to like components, parts, steps, and processes.

DETAILED DESCRIPTION

Certain embodiments of the present disclosure can be appreciated in the context of providing the capability to rapidly tune voltage-controlled oscillators (VCOs) and similar oscillating circuits at a late stage of a design/fabrication cycle. VCOs and similar oscillating circuits can be used within electronic equipment such as processor integrated circuits (ICs), which may be used to provide computational capabilities to electronic equipment such as servers. Such servers may include, but are not limited to web servers, application servers, mail servers, and virtual servers. While not necessarily limited thereto, embodiments discussed in this context can facilitate an understanding of various aspects of the disclosure. Certain embodiments may also be directed towards other equipment and associated applications, such as providing rapid, late-stage VCO tuning capability for ICs used in electronic equipment such as computing systems, which may be used in a wide variety of computational and data processing applications. Such computing systems may include, but are not limited to, supercomputers, high-performance computing (HPC) systems, and other types of special-purpose computers. Embodiments may also be directed towards providing rapid, late-stage VCO tuning capability for ICs used in consumer and small office/home office (SOHO) electronic equipment such as personal computers, laptops, mobile and network server devices.

The term "VCO" is used herein in reference to an oscillator circuit having an output frequency that is controlled or modulated by at least one input voltage. It is understood that a phase-locked loop (PLL) circuit may contain a VCO in conjunction with additional feedback and control circuits. For ease of discussion within the present disclosure, the terms "VCO" and "PLL" may be used interchangeably in the context of circuits used to generate and control frequency and phase of clock signals within an IC.

While the figures and associated text of the present disclosure are generally directed towards VCO and PLL type circuits, aspects of the present disclosure can also be applied to a variety of oscillating circuits, particularly circuit types designed around or incorporating an inductive-capacitive (LC) resonant "tank" circuit topology. Certain aspects of the present disclosure can also be applied to a broader class of tunable/resonant circuits that employ late-stage selectable components such as capacitors or inductors as tuning elements.

PLLs are control circuits designed to maintain a fixed phase relationship between a received input signal and a driven output signal. PLLs can be used within a wide variety of electronic circuit types such as radio-frequency (RF), telecommunications and computers/computing systems. PLLs can be particularly useful within computer systems for generating very high-frequency, low jitter clock signals used to precisely synchronize the operation of logic circuits within an IC. PLLs used for generating clock signals within an integrated circuit (IC) generally include a VCO circuit.

VCOs designed to generate IC logic clock signals can be operated at up to twice the frequency of the IC logic clock signals. The operating frequency of VCOs used in modern digital ICs can thus be particularly high, e.g., above 50 GHz. The design of VCOs running at such high frequencies requires meticulous and accurate circuit modeling and simulation in order to ensure that specified design targets for VCO operating frequency, jitter, phase noise and overall stability are met.

The modeling, simulation and analysis of high-frequency VCO performance includes a number of significant challenges. For example, high-frequency VCO circuits can be extremely sensitive to semiconductor manufacturing process parameter variations and to incorrect or inaccurate capacitance values.

The semiconductor, e.g., silicon, manufacturing processes for ICs including PLLs is often new and under development during a PLL design cycle. This process immaturity can result in process and device models that are subject to changing as the manufacturing process evolves and matures. Early in a chip/PLL design cycle, computer device modeling of capacitors, for example, may not be accurate, which can lead to costly and time-consuming re-designs and repeated IC fabrications. Resulting device model changes can drive repeated re-tuning of an LC VCO circuit in order to cause it to meet specified performance requirements.

In addition to process-driven model changes, VCO circuit designs can include electronic components such as varactors, inductors and planar oxide capacitors that may not be commonly fabricated within an IC, alongside more commonly employed devices such as N-channel and P-channel transistors. Modifications to the values and/or interconnect topologies of these "uncommon" components in a VCO/PLL circuit can require extensive layout and fabrication changes to a large number of IC process layers including deep trench (DT), polysilicon, diffusion and multiple metal interconnect layers. Such layout and fabrication changes can result in extended design and fabrication schedule delays and greatly increased development cost.

Embodiments of the present disclosure can be useful for providing a range of capacitance values for interconnection within a VCO or other type of LC oscillator circuit. Such a range of capacitance values can be particularly useful for "late-stage" VCO tuning, i.e., tuning after a significant portion of semiconductor processing steps have been completed. The use of such selectable tuning capacitors can be useful in managing and limiting VCO design effort, design/fabrication cycle time and cost. Embodiments can assist in isolating a VCO design/fabrication cycle from the detrimental effects of circuit sensitivity to device modeling parameters which may change frequently throughout a semiconductor technology development process. A PLL circuit and associated design methodology can be useful for protecting a PLL design against a likely process parameter shift experienced during an IC manufacturing process development cycle.

Embodiments of the present disclosure can include a VCO that can be rapidly tuned, thus allowing aggressive design, development and fabrication schedules for high-performance ICs such as processors and storage controllers.

Substantial reduction in VCO and IC design and fabrication times/cost can result from use of various embodiments of the present disclosure.

Certain embodiments relate to a VCO circuit and an associated design methodology that provide for late-stage VCO tuning through the use of selectively interconnected tuning capacitors. FIG. 1 includes a schematic view 100 of a tunable VCO circuit located within an IC 105, a consistent cross-sectional view 150 of the VCO and an isometric view 175 of selectable VCO parallel plate tuning capacitors, according to embodiments of the present disclosure. In embodiments, the VCO can be configured to generate signals for clocking digital logic within ICs such as application-specific integrated circuits (ASICs), processors, memories or special-purpose ICs. In some embodiments, such a VCO can be used without additional feedback and control circuitry, and in some embodiments the VCO can be integrated with additional feedback and control circuitry into a PLL circuit. A VCO as depicted in FIG. 1 can be fabricated with a wide variety of IC technologies and associated design methodologies, including, but not limited to, complementary metal-oxide semiconductor (CMOS), silicon on insulator (SOI), gallium arsenide (GaAs) and silicon-germanium (SiGe) IC technologies.

The interrelated and consistent views 100 and 150 of FIG. 1 can provide a visual understanding of the correspondence between a schematic depiction of various VCO components and interconnections and the relative physical locations of those components and interconnections within the various layers of an IC cross-section. For example, view 100 schematically depicts VCO portion 110 which includes various active and passive circuit components, while view 150 depicts the general location of these components within VCO portion 110, which is fabricated in lower layers 112 of the IC. Similarly, view 100 depicts VCO portion 120 which includes selectable tuning capacitors, e.g., capacitors C1, C1 . . . Cn, while view 150 depicts the location of these selectable tuning capacitors within VCO portion 120, which is fabricated in upper layers 122 of the IC.

According to embodiments, VCO portion 110 can include components such as varactors ($C_{VAR}$), an inductor (L), digitally switched band capacitors ($C_{BAND}$), P-channel and N-channel transistors N1, N2 and P1 and P2, respectively. Varactors $C_{VAR}$, band capacitors $C_{BAND}$ and inductor L are interconnected to form an inductive-capacitive (LC) tank circuit which can oscillate at a characteristic resonant frequency "f," as defined by the following equations:

$$f = \frac{1}{2\pi\sqrt{LC}}$$

Where:
f=frequency in hertz (Hz)
L=inductance in henrys (H)
$C_T$=total capacitance in farad (F)
and $$C_T = \sum C_{VAR} + \sum C_{BAND} + \sum_{1}^{n} Cn$$

Where:
$C_T$=total capacitance of the LC tank circuit in farad (F)
$\Sigma C_{VAR}$=sum of the capacitances of the varactors in farad (F)
$\Sigma C_{BAND}$=sum of the capacitances of the band capacitors in farad (F)
$\Sigma C_n$=sum of the capacitances of selected tuning capacitors in farad (F)

This LC tank circuit is used as the basis of the VCO's oscillation, while transistors N1, N2, P1 and P2 are configured to periodically add energy to the tank circuit to perpetuate its oscillation. According to embodiments, the operating frequency f of the tank circuit/VCO depends on $C_T$, which includes the sum of the capacitances of selected tuning capacitors ($\Sigma C_n$). The operating frequency f of the VCO can thus be tuned by varying the sum of the capacitances of selected tuning capacitors ($\Sigma C_n$).

According to embodiments, logical input values can be applied, for example, from digital logic within the IC 105, to the BAND0 . . . BAND3 band select inputs, which can result in a change of the effective capacitance value of one or more of the $C_{BAND}$ capacitors. Changing the effective capacitance of one or more of the $C_{BAND}$ capacitors can be useful for dynamically modifying, for example, with interconnected digital circuits, the resonant frequency f of the LC tank circuit/VCO, according to the above equations. According to embodiments, types of $C_{BAND}$ capacitors can include, but are not limited to, Metal-Insulator-Metal (MIM) capacitors, planar oxide capacitors and thin oxide fin caps.

In some embodiments, values of the $C_{BAND}$ capacitors can be "binary-weighted." For example, the $C_{BAND}$ capacitor associated with the BAND1 input can have 2× the capacitance of the $C_{BAND}$ capacitor associated with the BAND0 input. Similarly, the $C_{BAND}$ capacitor associated with the BAND2 input can have 2× the capacitance of the $C_{BAND}$ capacitor associated with the BAND1 input, and so on. Using this binary-weighted scheme with four BAND inputs, as depicted in view 100, can yield 16 possible selectable capacitance values that are available for use in modifying the frequency of the VCO. In some embodiments the $C_{BAND}$ capacitors can be configured as a thermometer code capacitor bank.

Although a VCO or PLL circuit can be useful within a digital logic IC for generating stable, phase-aligned clock signals for logic circuits of the IC, the design process for such a VCO can present many difficult challenges, as described below. For example, a VCO portion, e.g., 110, can include "uncommon" components such as varactors $C_{VAR}$, inductor L, and planar oxide capacitors $C_{BAND}$. These components can have electrical properties that are useful in the design of stable, high-frequency VCO circuits, however they may not be commonly fabricated within a digital logic IC into which a VCO is implemented. Manufacturing process parameters of IC technologies that are developed or are in development primarily for implementing digital logic functions can change significantly during a technology development process. Additionally, process parameters for such logic functions may not be optimized for certain types of "uncommon" components particularly suitable for VCO designs.

Manufacturing process parameters critical to the operation of components used in VCO circuits may also not be closely controlled during development of a digital IC technology. Accordingly, changes in these process parameters can cause changes to "uncommon" VCO component electrical characteristics which can be difficult to control, predict and/or model in VCO circuit simulations. A circuit designer may also need to change values and/or interconnect topologies of these uncommon components during VCO circuit development in order to compensate for changing component characteristics and/or other factors. Such changes may be deemed necessary in order to meet aggressive design schedules and highly constrained design requirements such as output frequency, jitter and overall stability. Modifications to values and/or interconnect topologies of these uncommon components in a VCO/PLL circuit can require extensive layout and fabrication changes to a large number of IC process layers including deep trench (DT), polysilicon, diffusion and multiple metal interconnect layers. Such layout and fabrication changes can result in extended design and fabrication time, schedule delays and greatly increased development costs.

According to embodiments, VCO portion 120 can include a number of selectable tuning capacitors, e.g., C1, C2 ... Cn, which can be interconnected to the VCO portion 110 at a late, e.g., upper level metallization, stage in an IC fabrication process. Establishing such interconnections can be useful in selecting particular capacitance values to include in the sum of the selectable tuning capacitors. As described above, the operating frequency f of the VCO can be tuned by varying the sum of the capacitances of selectable tuning capacitors ($\Sigma C_n$).

Varying the operating frequency f of the VCO through late-stage tuning capacitor selection can be useful in overcoming the above-described VCO design challenges. For example, the instability and lack of optimization of IC manufacturing process parameters, changing VCO electrical component characteristics, and component/interconnect topology changes may be compensated for through the use of late-stage IC fabrication tuning. Such tuning can be used to change, through selective interconnection of an amount of selectable tuning capacitance, an operating frequency f of the VCO to meet a specified VCO frequency requirement. Such tuning can be useful for meeting both VCO design goals and development schedule requirements without resorting to extensive layout and fabrication changes and multiple, iterations of component model creation for uncommon VCO components. The use of such late-stage design tuning can result in significantly reduced development cost, development time and number of IC fabrication iterations.

The lower layers 112 of VCO portion 110 can be fabricated using a set of front end of line (FEOL) operations consistent with operations used in the fabrication of digital ICs. Such process operations can include diffusion, annealing, ion implantation, etching and lower layer metal deposition. These operations can be useful for creating active components such as P-channel field-effect transistors (PFETs), N-channel field-effect transistor (NFETs) and passive components such as inductors, varactors and capacitors, as depicted in VCO portion 110. These component types may be difficult or impossible to fabricate, using existing IC fabrication processes, within upper layers 122 of the IC.

The upper layers 122, located above lower layers 112, of VCO portion 120 can similarly be fabricated using a set of mature back end of line (BEOL) operations that are performed after the FEOL operations are completed. Such process operations can include oxide layer growth, metal deposition and layer planarization. According to embodiments, these process steps can be useful for creating selectable and customizable tuning capacitors C1 ... Cn having electrically conductive structures, e.g., capacitor plates PA, PB, separated by a dielectric material 125. These operations can also be used to create electrical interconnect structures such as wiring and vias, e.g., V1A ... VnA and V1B ... VnB, used to connect selectable tuning capacitors C1 ... Cn to components of VCO portion 110.

The upper layers 122 can also include interconnect wiring structures used to interconnect various electronic components, e.g., field-effect transistors (FETS) and logic functions, within the IC. According to embodiments, upper layers 122 can include at least two layers in which electrically conductive structures of selectable tuning capacitors are fabricated. FIG. 1 depicts a particular configuration of IC layers; other IC layer arrangements including different numbers and positioning of layers are contemplated, within the sprit and scope of the present disclosure.

In some embodiments the selectable tuning capacitors C1, C2 ... Cn, as depicted in view 150, can be MIM type capacitors having two electrically conductive structures fabricated from a metal such as aluminum, copper, tungsten, or alloys thereof, separated by a dielectric material 125 such as $SiO_2$, a high-K dielectric, or another type of dielectric material. According to embodiments, a set of selectable tuning capacitors C1, C2 ... Cn can include capacitors of various sizes/capacitance values, for example, binary-weighted capacitance values. In some embodiments, a set of selectable tuning capacitors can be designed to have equivalent capacitance values. Selectable tuning capacitors can also include "spare," repurposed IC power supply decoupling capacitors.

In some embodiments, the electrically conductive structures of selectable tuning capacitors can include two or more parallel plates, arranged in a stacked configuration, as depicted in consistent views 150 and 175 of FIG. 1. In some embodiments, the electrically conductive structures can be designed as interdigitated metal finger structures and/or orthogonally oriented comb structures fabricated on at least two layers of the set of upper layers.

In some embodiments the sum of the capacitances of selected tuning capacitors ($\Sigma C_n$) can be in a range proportional to, for example, between 8% and 12% of, the sum of the capacitances of the band capacitors ($\Sigma C_{BAND}$). In some embodiments $\Sigma C_n$ can be in a particular specified value range, e.g., between 4 pF and 6 pF. According to embodiments, an initial VCO design can include a number of interconnected selectable tuning capacitors, e.g., MIM, capacitors, according to initial VCO simulation results. The number of interconnected selectable tuning capacitors can be modified in subsequent VCO designs, which can be useful in reducing design and fabrication cycle time and meeting design schedules.

In some embodiments, the set of selectable interconnect structures can include vias, e.g., V1A ... VnA and V1B ... VnB, and in some embodiments the set of selectable interconnect structures can include wiring consistent with wires used to interconnect components within an IC. In accordance with particular VCO design requirements, a particular VCO design may include any number of selectable interconnect structures electrically connecting, through nodes A and B, selectable tuning capacitors C1, C2 ... Cn to VCO components fabricated within VCO portion 110. For example, a particular VCO design may include none of the selectable interconnect structures, another VCO design may include a portion of the structures, and another design may include all of the available selectable interconnect structures.

In embodiments, selectable interconnect structures such as vias can be useful for allowing a varied numbers of selectable tuning capacitors to be connected to a VCO or LC tank circuit. Varying a number of interconnected selectable tuning capacitors can be useful in providing precise late-stage VCO frequency tuning by increasing or decreasing the total capacitance of the VCO circuit. It can be understood that, in embodiments including parallel plate capacitors, that the total capacitance of interconnected selectable tuning capacitors is proportional to the total plate area of these capacitors. In embodiments containing other types of selectable tuning capacitor structures, the total capacitance is generally proportional to the total overlap and/or adjacent surface area of the electrically conductive structures comprising such a capacitor. In embodiments, selectable vias, e.g., V1A, V1B, can also be useful for reducing resistance of electrical connections to the selectable tuning capacitors relative to other types of electrical connections, e.g., FETs, fuses, e-fuses and the like. Consistent with IC fabrication methodologies, capacitors and interconnect structures can be fabricated in accordance with IC fabrication masks created from one or more design files containing IC layout data.

View 175 depicts a parallel plate capacitor consistent with the capacitors C1, C2 . . . Cn included in views 100 and 150. According to embodiments, a parallel plate capacitor can include two or more electrically conductive structures, i.e., plates, separated by a dielectric material 125. In embodiments, the two or more plates, e.g., plates PA and PB, can be electrically interconnected to other components in a VCO circuit by wiring structures and by vias V1A . . . VnA and V1B . . . VnB.

In general, the capacitance of a parallel plate capacitor having two plates each having a conductive plate area "A" and plate separation "t" is determined in accordance with the following equations:

$$C = k\varepsilon_0 \times \frac{A}{t}$$

Where:
C=capacitance (farad or Coulomb/Volt)
k=relative permittivity of the dielectric material between the plates (k=1 for free space, k=1 for air, k>1 for all other media,)
$\varepsilon_0$=permittivity of free space=$8.854 \times 10^{-12}$ F/m (farads per meter)
A=plate area of each capacitive element (m$^2$)
t=distance between the plates or dielectric thickness (m)
and:

$$A = W \times L$$

Where:
A=plate area of each capacitive element (m$^2$)
W=width of the plate (m)
L=length of the plate (m)

In the parallel plate capacitor examples depicted in view 150 and 175, three plates, separated by two layers of dielectric 125 are depicted, thus forming two parallel plate capacitors. It can be understood that the total capacitance of these capacitors is equal to the sum of the capacitance "C" of each of the capacitors. In some embodiments selectable tuning capacitors can include parallel plate capacitors, as depicted and discussed herein. Other types of metal and dielectric layer arrangement are contemplated, for example, selectable tuning capacitors can include structures including, but not limited to, interdigitated metal finger structures and/or orthogonally oriented comb structures fabricated on at least two layers of the set of upper layers.

Figure 2:
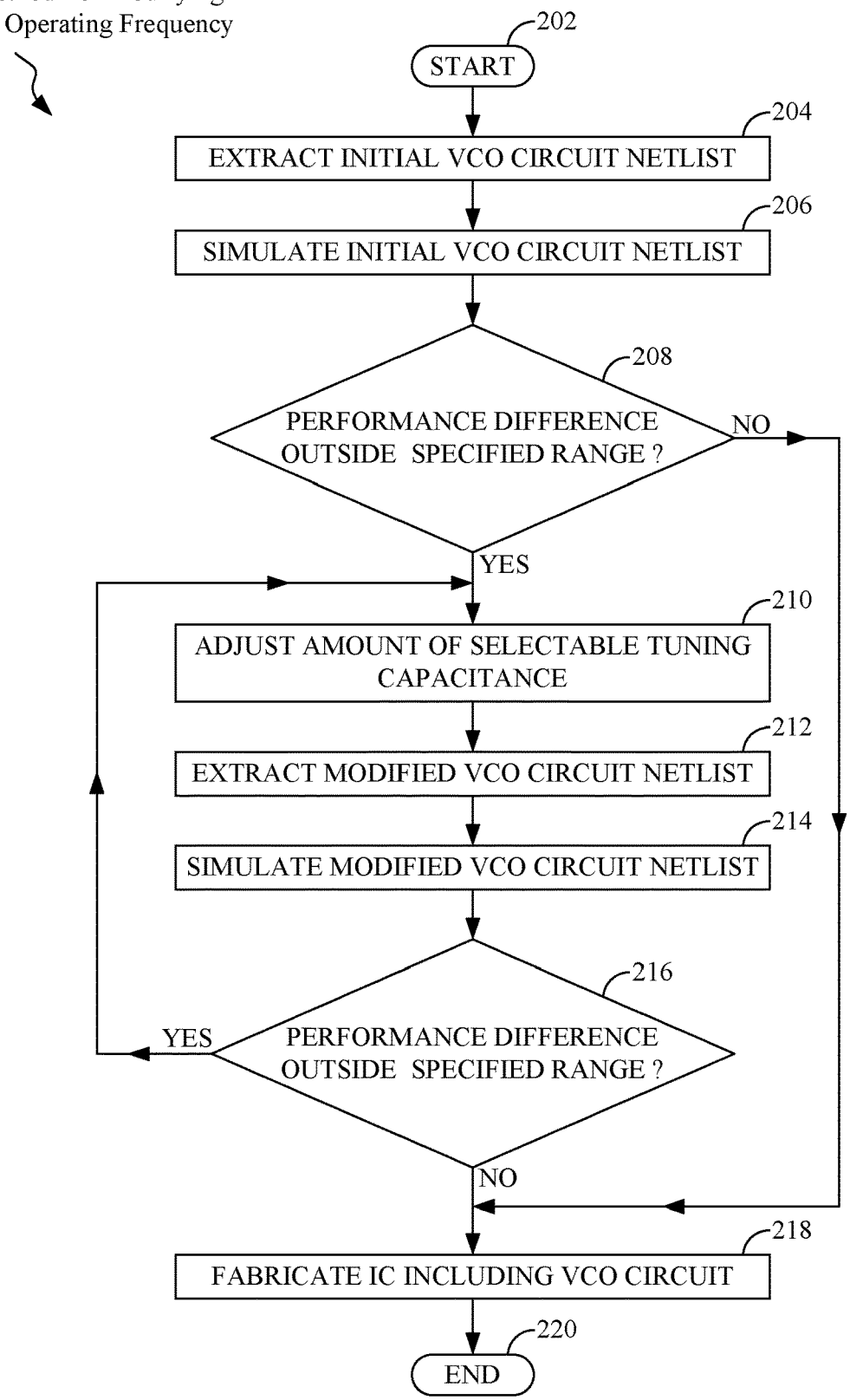
FIG. 2 is a flow diagram depicting a method of modifying an operating frequency of a VCO fabricated within an IC, according to embodiments consistent with the figures.

FIG. 2 is a flow diagram depicting a method 200 for modifying a VCO operating frequency, according to embodiments consistent with the figures. The use of method 200 can result in precise VCO frequency tuning by providing for modifications to the total VCO capacitance at a late stage in an IC fabrication process. When used within an IC design and fabrication cycle, method 200 can also allow a circuit designer to rapidly modify VCO operating parameters without having to redesign a large portion of a VCO circuit design. Such late-stage VCO tuning can result in an accelerated IC and fabrication design cycle for a new semiconductor technology and significantly increased VCO frequency precision and control.

The method 200 moves from start 202 to operation 204. Operation 204 generally refers to extracting an initial VCO circuit netlist from an initial VCO layout. Initial VCO circuit netlist extraction can be useful in creating an electronic representation, within one or more design files located within a computer, of a specified initial VCO design. In embodiments, an initial VCO circuit netlist including component instantiation and connectivity data corresponding to the initial VCO circuit layout can be extracted from the layout by using an electronic design automation (EDA) tool such as a layout extraction tool. Certain VCO layouts and corresponding extracted netlists can include a set of interconnect structures configured to select a total capacitance of the selectable tuning capacitors by interconnecting the selectable tuning capacitors to an active portion of the VCO circuit. Certain VCO layouts and corresponding extracted netlists may not include such a set of configurable interconnect structures. The inclusion or lack of configurable interconnect structures within an initial VCO layout and netlist may be determined by a VCO circuit designer. Once the initial VCO circuit netlist is extracted, the method 200 moves to operation 206.

Operation 206 generally refers to simulating the initial VCO netlist to produce initial simulation results. Initial simulation results can be used by VCO designer to quantify and evaluate the expected performance, e.g., operating frequency or jitter, of an initial VCO circuit design, as represented by the initial VCO layout and netlist. In embodiments, initial VCO simulations can be performed by using a circuit-level simulator in conjunction with the extracted initial VCO netlist and a set of VCO component device models. Such a circuit-level simulator can be integrated into a set of EDA tools run on a computer system. Initial VCO simulation results can include waveform data, e.g., voltage vs. time plots, frequency spectrum data, e.g., amplitude vs. frequency plots or jitter histogram plots. In embodiments, the initial VCO simulation results can be stored within one or more design files located within a computer. According to embodiments, initial VCO simulation results can reflect the presence or absence of selectable tuning capacitors interconnected to the active portion of the VCO circuit, in accordance with the contents of the initial VCO layout and netlist, as described in reference to operation 204. Once the initial VCO netlist has been simulated, the method 200 moves to operation 208.

At operation 208, a determination is made regarding whether a performance difference between initial simulation results and a set of performance requirements is outside of a specified performance range. According to embodiments, a specified performance range can be used to indicate a tolerance or acceptable performance difference from simulation under which it is expected that a fabricated VCO circuit will perform as specified. For example, performance requirements or design targets may specify that a VCO circuit operate at a frequency fthat is within a specified range of 20 MHz of a nominal frequency of 50 GHz. Other specified ranges besides frequency are contemplated, for example, deterministic jitter, long-term jitter, phase noise, and the like. In some embodiments, the set of performance requirements can include, for example, an oscillation frequency f that is greater than 50 GHz. Operation 208 can be useful in determining whether the VCO design, as modeled and simulated, is expected to perform according to design specifications once it is fabricated. In some embodiments, a comparison between initial simulation results and performance requirements can be performed by a tool within a set of EDA tools run on a computer system. In some embodiments a VCO designer may interact with various EDA tools and data displays that are output from such tools. In some embodiments, hardware performance measurements from fabricated hardware, for example, an IC including a VCO, can be used in conjunction with initial simulation results and compared against the set of performance requirements. If the performance difference is outside of the specified range, the method 200 moves to operation 210. If the performance difference is not outside of the specified range, the method 200 moves to operation 218.

Operation 210 generally refers to adjusting an amount of selectable tuning capacitance, in response to the performance difference being outside of the specified range, as determined in operation 208. In embodiments, adjusting the amount of selectable tuning capacitance can include adding or removing selectable interconnect structures to an IC design file by using an IC layout editor that is part of a set of EDA tools run on a computer. Adding or removing selectable interconnect structures can be useful in increasing or decreasing a tuning capacitance connected to the VCO circuit, which can result in adjustments to the VCO operating frequency f. A VCO circuit designer can use a variety of tools within the set of EDA tools to determine an amount of selectable tuning capacitance to be added to or removed from the initial VCO design. Once the amount of selectable tuning capacitance has been adjusted, the method 200 moves to operation 212.

Operation 212 generally refers to extracting a modified VCO circuit netlist from the modified VCO layout. Modified VCO circuit netlist extraction can be useful in creating an electronic representation, within one or more design files located within a computer, of a specified modified VCO design. In embodiments, the modified VCO circuit netlist including component instantiation and connectivity data corresponding to the modified VCO circuit layout can be extracted from the layout by using an EDA tool such as a layout extraction tool. Certain VCO layouts and corresponding extracted netlists can include a set of interconnect structures configured to select a total capacitance of the selectable tuning capacitors by interconnecting the selectable tuning capacitors to an active portion of the VCO circuit. Certain VCO layouts and corresponding extracted netlists may not include such a set of configurable interconnect structures. The inclusion or lack of configurable interconnect structures within a modified VCO layout and netlist may be determined by a VCO circuit designer. Once the modified VCO circuit netlist is extracted, the method 200 moves to operation 214.

Operation 214 generally refers to simulating the modified VCO netlist to produce modified simulation results. Modified simulation results can be used by VCO designer to quantify and evaluate the expected performance, e.g., operating frequency or jitter, of a modified VCO circuit design, as represented by the modified VCO layout and netlist. In embodiments, modified VCO simulations can be performed by using a circuit-level simulator in conjunction with the extracted modified VCO netlist and a set of VCO component device models. Such a circuit-level simulator can be integrated into a set of EDA tools run on a computer system. Modified VCO simulation results can include waveform data, e.g., voltage vs. time plots, frequency spectrum data, e.g., amplitude vs. frequency plots or jitter histogram plots. In embodiments, the modified VCO simulation results can be stored within one or more design files located within a computer. According to embodiments, modified VCO simulation results can reflect the presence or absence of selectable tuning capacitors interconnected to the active portion of the VCO circuit, in accordance with the contents of the modified VCO layout and netlist, as described in reference to operation 212. Once the modified VCO netlist has been simulated, the method 200 moves to operation 216.

At operation 216, a determination is made regarding whether a performance difference between modified simulation results and a set of performance requirements is outside of a specified performance range. According to embodiments, a specified performance range can be used to indicate a tolerance or acceptable performance difference from simulation under which it is expected that an actual VCO circuit will perform as specified. For example, performance requirements or design targets may specify that a VCO design should operate at a frequency f that is within a specified range of 20 MHz of a nominal frequency of 50 GHz. Other specified ranges besides frequency are contemplated, for example, deterministic jitter, long-term jitter, phase noise, and the like. In some embodiments, the set of performance requirements can include, for example, an oscillation frequency f that is greater than 50 GHz. Operation 216 can be useful in determining whether the VCO design, as modeled and simulated, is expected to perform according to design specifications once it is fabricated. In some embodiments, a comparison between modified simulation results and performance requirements can be performed by a tool within a set of EDA tools run on a computer system. In some embodiments a VCO designer may interact with various EDA tools and data displays are outputs from such tools. In some embodiments, hardware performance measurements from fabricated hardware, for example, an IC including a VCO, can be used in conjunction with modified simulation results and compared against the set of performance requirements. If the performance difference is outside of the specified range, the method 200 returns to operation 210. If the performance difference is not outside of the specified range, the method 200 moves to operation 218.

Operation 218 generally refers to fabricating the IC that includes the VCO circuit. According to embodiments, the VCO circuit can be fabricated in response to the updated performance difference being within the specified range, as determined in operation 216. According to embodiments, the VCO circuit is fabricated, in accordance with the data contained within the IC design file, at a semiconductor manufacturing facility. An IC containing the VCO includes, within the set of lower layers of the IC, e.g., lower layers 112 of FIG. 1, the first portion of the VCO, e.g., VCO portion 110 of FIG. 1, and within the set of upper layers of the IC, e.g., upper layers 122 of FIG. 1, the second portion of the VCO, e.g., VCO portion 120 of FIG. 1. The fabrication includes the use of at least one masking process operation and at least one deposition process operation. Once the IC including the VCO circuit has been fabricated, the process 200 may end at block 220.

Figure 3:
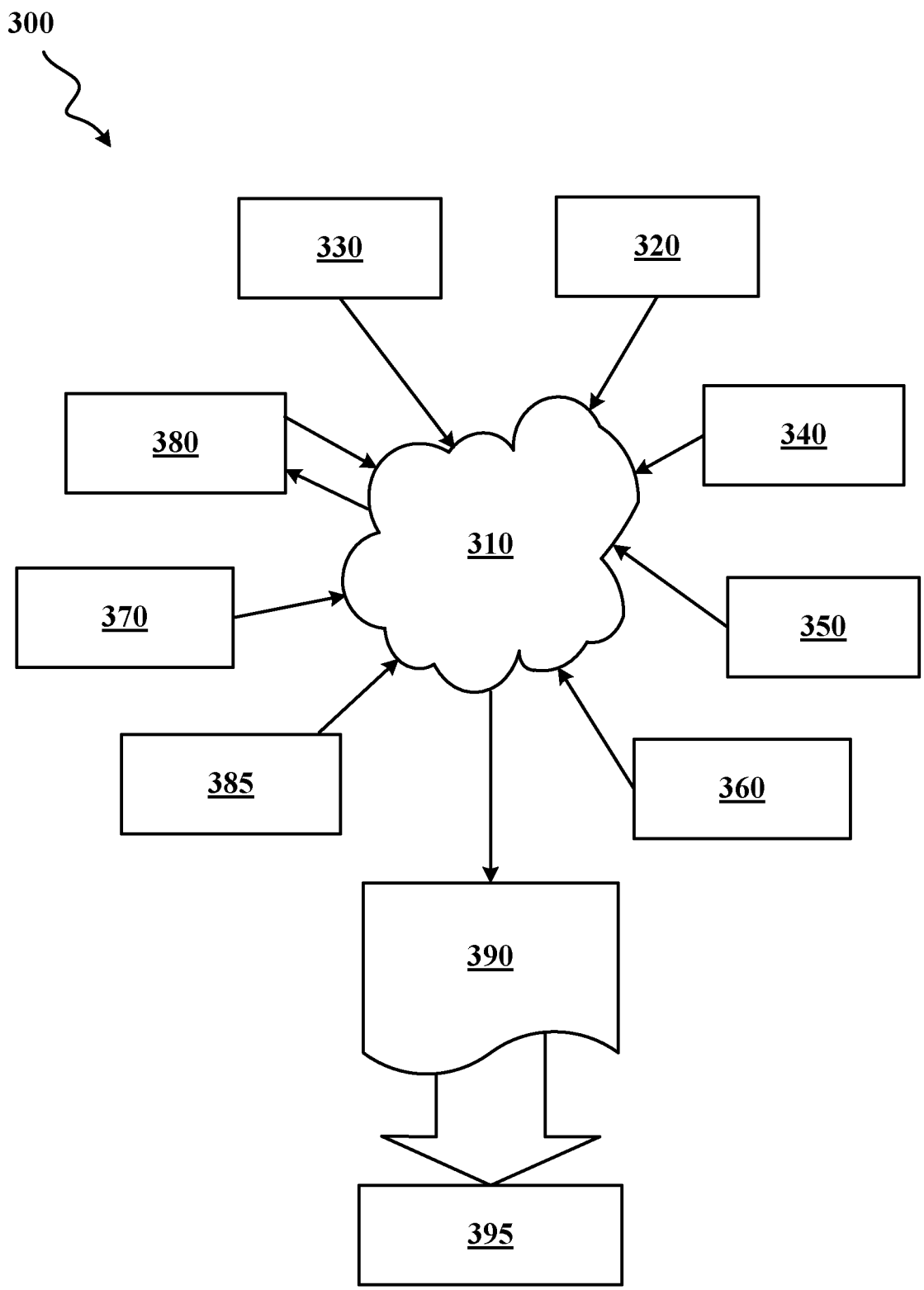
FIG. 3 illustrates multiple design structures including an input design structure that is preferably processed by a design process, according to embodiments consistent with the figures.

FIG. 3 depicts multiple design structures 300 including an input design structure 320 that is preferably processed by a design process, according to embodiments consistent with the figures. Design structure 320 may be a logical simulation design structure generated and processed by design process 310 to produce a logically equivalent functional representation of a hardware device. Design structure 320 may alternatively include data or program instructions that, when processed by design process 310, generate a functional representation of the physical structure of a hardware device. Whether representing functional or structural design features, design structure 320 may be generated using electronic computer-aided design, such as that implemented by a core developer/designer. When encoded on a machine-readable data transmission, gate array, or storage medium, design structure 320 may be accessed and processed by one or more hardware or software modules within design process 310 to simulate or otherwise functionally represent an electronic component, circuit, electronic or logic module, apparatus, device, or system such as those depicted in FIG. 1-2. As such, design structure 320 may include files or other data structures including human or machine-readable source code, compiled structures, and computer-executable code structures that, when processed by a design or simulation data processing system, functionally simulate or otherwise represent circuits or other levels of hardware logic design. Such data structures may include hardware-description language design entities or other data structures conforming to or compatible with lower-level HDL design languages such as Verilog and VHDL, or higher level design languages such as C or C++.

Design process 310 preferably employs and incorporates hardware or software modules for synthesizing, translating, or otherwise processing a design/simulation functional equivalent of the components, circuits, devices, or logic structures depicted in FIG. 1-2, to generate a Netlist 360 which may contain design structures such as design structure 320. Netlist 360 may comprise, for example, compiled or otherwise processed data structures representing a list of wires, discrete components, logic gates, control circuits, I/O devices, models, etc. that describe the connections to other elements and circuits in an integrated circuit design. Netlist 360 may be synthesized using an iterative process in which Netlist 360 is resynthesized one or more times depending on design specifications and parameters for the device. As with other design structure types described herein, Netlist 360 may be recorded on a machine-readable data storage medium or programmed into a programmable gate array. The medium may be a non-volatile storage medium such as a magnetic or optical disk drive, a programmable gate array, a compact flash, or other flash memory. Additionally, the medium may be a system or cache memory, buffer space, or electrically or optically conductive devices and materials on which data packets may be transmitted and intermediately stored via the internet, or other suitable networking means.

Design process 310 may include hardware and software modules for processing a variety of input data structure types including Netlist 360. Such data structure types may reside, for example, within library elements 330 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 340, characterization data 350, verification data 380, design rules 370, and test data files 385 which may include input test patterns, output test results, and other testing information. Design process 310 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 310, without deviating from the scope and spirit of the disclosure. Design process 310 may also include modules for performing standard circuit design processes such as timing analysis, verification, design rule checking, place and route operations, etc.

Design process 310 employs and incorporates logic and physical design tools such as HDL compilers and simulation model build tools to process design structure 320 together with some or all of the depicted supporting data structures, along with any additional mechanical design or data, to generate a second design structure 390. Design structure 390 resides on a storage medium or programmable gate array in a data format used for the exchange of data of mechanical devices and structures (e.g., information stored on an IGES, DXF, Parasolid XT, JT, DRG, or any other suitable format for storing or rendering such mechanical design structures). Similar to design structure 320, design structure 390 preferably comprises one or more files, data structures, or other computer-encoded data or instructions that reside on transmission or data storage media and that, when processed by an ECAD system, generate a logically or otherwise functionally equivalent form of one or more of the embodiments of the disclosure depicted in FIG. 1-2. In one embodiment, design structure 390 may comprise a compiled, executable HDL simulation model that functionally simulates the devices depicted in FIG. 1-2.

Design structure 390 may also employ a data format used for the exchange of layout data of integrated circuits and/or symbolic data format (e.g., information stored in a GDSII, GL1, OASIS, map files, or any other suitable format for storing such design data structures). Design structure 390 may comprise information such as symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and depicted in FIG. 1-2. Design structure 390 may then proceed to a state 395 where, for example, design structure 390 proceeds to tape-out, is released to manufacturing, is released to a mask house, is sent to another design house, is sent back to the customer, etc.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:

1. A voltage-controlled oscillator (VCO) fabricated within an integrated circuit (IC), the VCO having an operating frequency at least partially dependent on a total capacitance of at least one selectable tuning capacitor, wherein the total capacitance of the at least one selectable tuning capacitor is within a range between 8% and 12% of a sum of a capacitance of band capacitors of the VCO, the VCO comprising:

a first portion that includes active electronic devices fabricated within a set of lower layers of the IC;

a second portion, fabricated within a set of upper layers of the IC located above the set of lower layers of the IC, the second portion including the at least one selectable tuning capacitor having electrically conductive structures separated by dielectric material; and a set of interconnect structures that is configurable to select a total capacitance of the at least one selectable tuning capacitor by electrically interconnecting the first portion of the VCO to capacitors of the at least one selectable tuning capacitor.

2. The VCO of claim 1, wherein the electrically conductive structures fabricated on at least one layer of the set of upper layers of the IC are selected from the group consisting of: parallel plates, interdigitated metal finger structures, and orthogonally oriented comb structures fabricated on at least two layers of the set of upper layers.

3. The VCO of claim 1, wherein the set of upper layers of the IC include IC wiring.

4. The VCO of claim 1, wherein at least one interconnect structure of the set of interconnect structures is configured to electrically interconnect the first portion of the VCO to a selectable tuning capacitor of the at least one selectable tuning capacitor.

5. The VCO of claim 1, wherein at least one interconnect structure of the set of interconnect structures is configured to electrically isolate the first portion of the VCO from the at least one selectable tuning capacitor.

6. The VCO of claim 1, wherein the set of interconnect structures includes vias configured to electrically interconnect the first portion of the VCO to the at least one selectable tuning capacitor.

7. The VCO of claim 1, wherein at least two capacitors of the at least one selectable tuning capacitor have equivalent capacitance values.

8. The VCO of claim 1, wherein the at least one selectable tuning capacitor includes capacitors having a plurality of unique capacitance values.

9. An integrated circuit (IC), the IC comprising:
a set of lower layers;
a set of upper layers located above the set of lower layers; and
a tunable circuit having an operating frequency at least partially dependent on a total capacitance of at least one selectable tuning capacitor, wherein the total capacitance of the at least one selectable tuning capacitor is within a range between 8% and 12% of a sum of a capacitance of band capacitors of the tunable circuit, the tunable circuit including:
a first portion that includes active electronic devices fabricated within the set of lower layers;
a second portion, fabricated within the set of upper layers, that includes the at least one selectable tuning capacitor having electrically conductive structures separated by dielectric material; and
a set of interconnect structures that is configurable to select a total capacitance of the at least one selectable tuning capacitor by electrically interconnecting the first portion of the tunable circuit to capacitors of the at least one selectable tuning capacitor.

10. The IC of claim 9, wherein capacitors of the at least one selectable tuning capacitor have a plurality of predetermined binary-weighted capacitance values.

11. The IC of claim 9, wherein the tunable circuit includes a circuit selected from the group consisting of: an inductive-capacitive (LC) tank circuit, and a voltage-controlled oscillator (VCO) circuit.

12. The IC of claim 9, wherein the at least one selectable tuning capacitor includes a Metal-Insulator-Metal (MIM) capacitor.

13. The IC of claim 9, wherein the total capacitance of the at least one selectable tuning capacitor is in a range between 4 pF and 6 pF.

14. A method, performed by a set of electronic design automation (EDA) tools executed by at least one processor circuit, of modifying an operating frequency of a voltage-controlled oscillator (VCO) circuit within an integrated circuit (IC), the VCO including a first portion containing active electronic devices fabricated within a set of lower layers of the IC, the VCO further including a second portion containing at least one selectable tuning capacitor fabricated within a set of upper layers of the IC, the operating frequency at least partially dependent on a total capacitance of the at least one selectable tuning capacitor, the method comprising:
extracting, with the set of EDA tools, an initial VCO netlist from an initial VCO layout, the initial VCO layout stored in an IC design file and including the at least one selectable tuning capacitor;
simulating, with the set of EDA tools, the initial VCO netlist to produce initial simulation results, the initial simulation results being stored in the design file;
comparing, with the set of EDA tools, the initial simulation results to a set of performance requirements to produce an initial performance difference;
adjusting, with the set of EDA tools, according to the initial performance difference being outside of a specified range, an amount of selectable tuning capacitance by changing, in the IC design file, data representing a set of interconnect structures configured to electrically connect the first portion of the VCO to the second portion of the VCO, the changing producing, within the IC design file, a modified VCO layout having a modified total capacitance of the at least one selectable tuning capacitor;
extracting, with the set of EDA tools, a modified VCO netlist from the modified VCO layout;
simulating, with the set of EDA tools, the modified VCO netlist to produce updated simulation results; and
comparing, with the set of EDA tools, the updated simulation results to the set of performance requirements to produce an updated performance difference.

15. The method of claim 14, further comprising fabricating, in response to the updated performance difference being within the specified range, in accordance with the data contained within the IC design file, the IC at a semiconductor manufacturing facility, the IC including, within the set of lower layers of the IC, the first portion of the VCO and within the set of upper layers of the IC, the second portion of the VCO, the fabricating including the use of at least one masking process operation and at least one deposition process operation.

16. The method of claim 14, wherein the adjusting the amount of selectable tuning capacitance includes performing an operation selected from the group consisting of: increasing a total capacitance of the at least one selectable tuning capacitor, and decreasing the total capacitance of the at least one selectable tuning capacitor.

17. The method of claim 14, wherein the comparing to produce an initial performance difference includes comparing a set of hardware performance measurements to the set of performance requirements.

18. The method of claim 14, wherein the set of performance requirements includes a specified oscillation frequency range of the VCO circuit.

19. The method of claim 14, wherein the set of performance requirements includes an oscillation frequency of the VCO circuit that is greater than 50 GHz.

\* \* \* \* \*